United States Patent [19]

Miura

[11] 4,188,596
[45] Feb. 12, 1980

[54] ELASTIC SURFACE WAVE DEVICE
[75] Inventor: Michiyori Miura, Yokohama, Japan
[73] Assignee: Hitachi, Ltd., Japan
[21] Appl. No.: 884,274
[22] Filed: Mar. 7, 1978
[30] Foreign Application Priority Data
  Mar. 7, 1977 [JP]  Japan .................................. 52-23812
[51] Int. Cl.² ........................ H03H 9/26; H03H 9/30;
                                   H03H 9/32; H01L 41/04
[52] U.S. Cl. ................................... 333/151; 310/313;
                                              310/326; 333/194
[58] Field of Search .............. 333/72, 30 R, 150–155,
            333/193–196; 331/107 A; 310/313, 326, 327;
                                                        330/5.5

[56] References Cited
U.S. PATENT DOCUMENTS 3,872,331  3/1975  Falco .................................... 310/313
4,096,455  6/1978  Drummond ....................... 333/72 X

FOREIGN PATENT DOCUMENTS 51-49970  4/1976  Japan .

Primary Examiner—Alfred E. Smith
Assistant Examiner—Marvin Nussbaum
Attorney, Agent, or Firm—Craig and Antonelli

[57] ABSTRACT

An elastic surface wave device for use as an electronic element such as a delay line or a filter in home-use electronic apparatus such as color television receivers and radio receivers and in industrial electronic apparatus such as electrical communication units. In the elastic surface wave device which comprises a substrate of piezo-electric material, an electro-mechanical input transducer converting an electrical input signal into an elastic surface wave, and a mechano-electrical output transducer disposed opposite to the input transducer through an elastic surface wave propagation path for converting the propagating elastic surface wave into the electrical signal again, at least two kinds of ultrasonic wave absorbing materials having different absorption coefficients for absorbing an unnecessary elastic surface wave portion are disposed in closely adjacent relation on the substrate surface in the region along the advancing direction of the unnecessary elastic surface wave portion between the opposite ends of the substrate, except the active region including the transducers and the propagation path, thereby improving the effect of unnecessary wave absorption.

7 Claims, 10 Drawing Figures

ELASTIC SURFACE WAVE DEVICE

LIST OF PRIOR ART REFERENCES (36 CFR 1.56 (a))

The following reference is cited to show the state of the art:

Japanese Utility Model Application Laid-Open No. 49970/1976

BACKGROUND OF THE INVENTION

1. Field of the Invention

This invention relates to inexpensive and adjustment-free elastic surface wave devices which can provide filters, delay lines, etc., commonly used in the field of home-use electronic apparatus and industrial electronic apparatus, and more particularly to an elastic surface wave device in which an unnecessary wave portion reflected back to the zone in the vicinity of the input and output electrodes and tending to deteriorate the signal-to-noise ratio (S/N ratio) of the electrical output signal is substantially attenuated or eliminated so as to improve the performance of the elastic surface wave device.

2. Description of the Prior Art

An unnecessary elastic surface wave portion reflected back from the end of a substrate of piezo-electric material forming an elastic surface wave device exerts a great influence on the S/N ratio of the electrical output signal of the element, and how to cope with such a problem is a matter of importance in this field of the art.

A technique disclosed by Zenith Radio Corporation in U.S. Pat. No. 3,872,331 issued in March, 1975 is supposed to be the first of the most classic technique proposed for dealing with the problem of the deterioration of the S/N ratio due to such an end-reflected unnecessary elastic surface wave, and various improvements have been made in the proposed technique up to date. The technique disclosed in this U.S. patent is derived as a secondary effect of the effort for fixing a chip of an elastic surface wave device in a predetermined position within a package by means of an elastic gasket.

The inventor has made researches and investigations on such a technique and has found that a technique disclosed in Japanese Utility Model Application Laid-Open No. 49970/1976 entitled "SURFACE WAVE DEVICE" is one of prior art disclosures related closely with the technique disclosed in the present application.

The disclosure of the cited application will be briefly described. The cited application describes that the mode of absorption of an unnecessary elastic surface wave portion propagating on an elastic surface wave device differs depending on the end regions of the substrate of the surface wave device. That is, there are two end regions, one of which is the end region having the same surface level as the elastic surface wave propagating surface of the substrate, and the other of which is the end region bordered from the first-mentioned end region by an edge line. According to the cited disclosure, absorbing materials having different physical properties are coated on these two regions respectively in view of the fact that the mode of elastic surface wave absorption in the former region differs from that in the latter region, and the reflection coefficient at these regions should be small.

The first absorbing material to be applied effectively to the first end region is such that it can sufficiently absorb ultrasonic waves and the propagation velocity of transverse waves (bulk velocity) therein is lower (or slower) than that of the substrate piezo-electric material which is the propagation medium.

Materials such as a silicone resin, a synthetic rubber material and a two-part liquid system polyurethane resin are cited as suitable materials, and as practical names of such materials, silicone rubber, butyl rubber or Desmophen #1700 (trademark), and Desmodur L (hardener; trademark) which is representative of the two-part liquid system polyurethane resin are disclosed.

The second absorbing material to be effectively applied to the second end region is such that it can sufficiently absorb ultrasonic waves and has an acoustic impedance $Z_C$ which is close to that $Z_A$ of the substrate and satisfies the relation $5\ Z_A > Z_C > 0.2\ Z_A$. Suitable materials disclosed therein include epoxy resins sold under the trademarks of Araldite E and Stycast #3050.

However, the prior art disclosure described above is not still fully satisfactory in the points described presently and a novel technique is required to replace the same.

The concept of means for preventing propagation of an unnecessary elastic surface wave portion reflected from the end of an elastic surface wave device will be described with reference to FIG. 1. Referring to FIG. 1 which is a schematic plan view of a prior art elastic surface wave device having a coating of elastic surface wave absorbing material thereon, an input electrode 2 for converting an electrical input signal into an elastic surface wave and an output electrode 3 for converting the elastic surface wave into the electrical signal again are disposed on the surface of a substrate 1 of piezo-electric material. Coatings 4 of elastic surface wave absorbing material are provided on the surface of the substrate 1 to attenuate or eliminate an unnecessary reflected elastic surface wave portion. The greater portion of the elastic surface wave generated by the input electrode 2 is converted into an electrical signal by the output electrode 3, and a portion of the remainder of the elastic surface wave reaches the elastic surface wave absorbing material layers 4 to be attenuated or eliminated thereby. The remaining portion of the elastic surface wave propagates along the surface of the substrate 1 of piezo-electric material without being attenuated and is reflected back from the end 5 of the element to be applied the output electrode 3 again. Although this reflected elastic surface wave portion is converted into the electrical signal again by the output electrode 3 in a delayed relation, the intensity of such an unnecessary reflected wave portion is sufficiently lower than when the coatings 4 of elastic surface wave absorbing material are not provided.

FIG. 2 shows the relation between the width of the coating of absorbing material and the intensity of the signal reflected from the end 5 relative to that of the main signal, when an epoxy-modified silicone resin is used as the absorbing material. It will be apparent from FIG. 2 illustrating the basic prinicple of the prior art technique, the relation between the width of the coating and the relative intensity of the reflected signal is not linear, and the relative intensity of the end-reflected signal does not show any substantial reduction when the width of the coating exceeds a certain constant value. This fact will be called herein a saturation phenomenon. Therefore application of the unnecessary reflected surface wave preventive coatings 4 having such a property to the elastic surface wave device fails to fully attenuate or eliminate the unnecessary reflected signal even when the width thereof is increased beyond the value shown in FIG. 2.

In regard to such a problem, the cited disclosure which is considered to have the deepest relationship with the present invention fails to show any effective solution which is reasonable and acceptable. In order to compensate the insufficiency, therefore, there is no other means than to widen the area of the end regions that is, to increase the size of the elastic surface wave device for the purpose of prevention of propagation of the unnecessary reflected surface wave. This has posed such a serious problem that the miniaturization and cost reduction demanded for a wave device of this kind cannot be attained.

SUMMARY OF THE INVENTION

It is an object of the present invention to provide a novel and improved elastic surface wave device which is provided with means for effectively attenuating or eliminating an unnecessary elastic surface wave portion reflected from the end of the substrate thereof.

Another object of the present invention is to provide an elastic surface wave device which is provided with means for reducing the adverse effect of an unnecessary surface wave portion propagating directly from the input electrode toward the output electrode without following the elastic surface wave propagation path and effectively attenuating or eliminating an unnecessary elastic surface wave portion reflected from the end of the substrate thereof.

For the attainment of the above objects, the intensity of the unnecessary signal portion reflected from the end of the elastic surface wave device should be efficiently reduced as will be briefly explained later. For this purpose, the elastic surface wave portion should be reflected at a large rate before it reaches the end of the element, that is, the reflection coefficient in a predetermined region should be selected to vary over a wide range. In other words, the acoustic impedance distribution in such a region should vary over a wide range.

In accordance with the present invention, there is provided an elastic surface wave device comprising a substrate of piezo-electric material, an input electrode disposed on the substrate surface for converting an electrical signal into an elastic surface wave, and an output electrode disposed in the elastic surface wave propagation path on the substrate surface for converting the propagating elastic surface wave into the electrical signal again, wherein at least two kinds of ultrasonic wave absorbing materials having different absorption coefficients for absorbing an unnecessary elastic surface wave portion are disposed in closely adjacent relation on the substrate surface in the region along the advancing direction of the unnecessary elastic surface wave portion between the opposite ends of the substrate, except the active region including the input electrode, the output electrode and the propagation path between the input and output electrodes.

DESCRIPTION OF THE PREFERRED EMBODIMENTS

For a better understanding of the present invention, the basic principle of the elastic surface wave device according to the present invention will be described at first. An important factor giving rise to the aforementioned saturation phenomenon is reflection of an elastic surface wave portion from the zone having the coating of ultrasonic wave absorbing material. The saturation phenomenon resulting from this reflection will now be discussed. Signal portions reflected from the coating of ultrasonic wave absorbing material on the substrate of piezo-electric material should be observed before such signal portions arrive at the end of the substrate of the elastic surface wave device. Such signal portions are not observed since it is presumed that they have no regularity or they are random signals in regard to their phase and thus cancel one another. Due to such a cancellation effect, the saturation phenomenon is observed in the advancing direction of ultrasonic waves propagating through the coating of ultrasonic wave absorbing material. The present invention is based on such an interpretation of the saturation phenomenon, and its basic idea will be described with reference to FIGS. 3 to 8.

Figure 3:
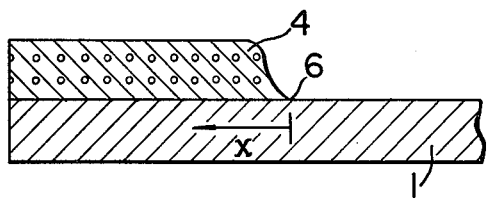
FIG. 3 is a schematic enlarged sectional view to show the state of the coating of ultrasonic wave absorbing material adjacent to the end of the elastic surface wave device.

FIG. 3 shows, in section, part of the elastic surface wave device having the coating 4 of ultrasonic wave absorbing material. Suppose that Zb is the acoustic impedance of the element portion having the coating 4 of ultrasonic wave absorbing material, and Za is the acoustic impedance of the element portion not having the coating 4. Then, as will be readily seen, the acoustic impedance Zb is dependent upon the acoustic impedance of the coating 4 of ultrasonic wave absorbing material and the acoustic impedance Za.

Figure 4:
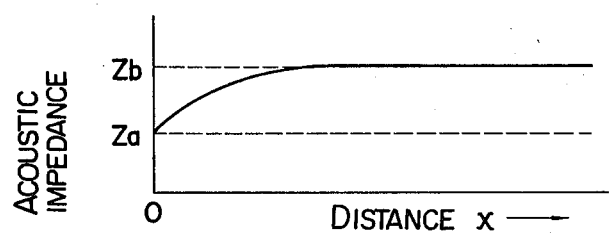
FIG. 4 is a graph showing the variation of the acoustic impedance in the vicinity of the elastic surface wave device having the coating of ultrasonic wave absorbing material in the model shown in FIG. 3.

The results of various studies have proved that the transition from Za to Zb is not expressed by a step function, and the overall acoustic impedance Z can be approximated by the following function the curve of which is schematically shown in FIG. 4:

$$Z = Za \exp(-\delta x) + Zb\{1 - \exp(-\delta x)\}$$

where $\delta$ is an arbitrary constant, and x is the distance from the edge 6 of the coating 4 of ultrasonic wave absorbing material shown in FIG. 4.

Figure 5:
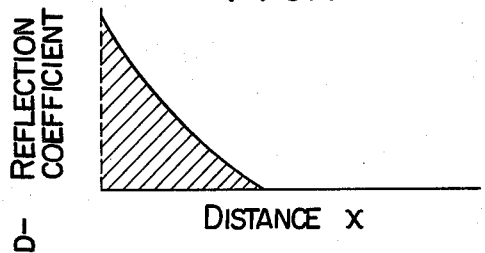
FIG. 5 is a graph showing the variation of the reflection coefficient of the element portion having the coating when this portion has the acoustic impedance characteristic shown in FIG. 4.

The reflection coefficient relative to the distance x is shown in FIG. 5, and the total reflection which is the sum of reflection at individual distances x is proportional to the area of the hatched portion in FIG. 5. This fact teaches that an unnecessary elastic surface wave portion reaching the end of the substrate of the device can be attenuated when the rate of reflection of such a wave portion is increased as much as possible before it reaches the end. Reflected wave portions can be attenuated or cancelled since their phase is random.

Figure 1:
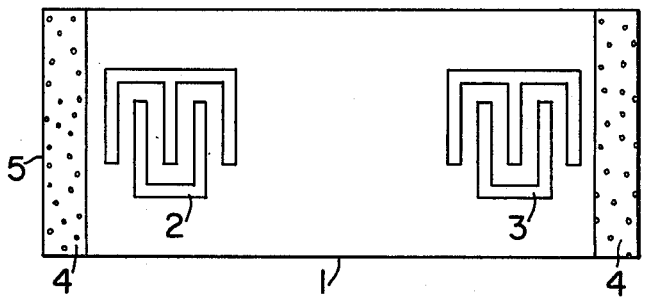
FIG. 1 is a schematic plan view showing the structure of a prior art reflection-free elastic surface wave device.
Figure 2:
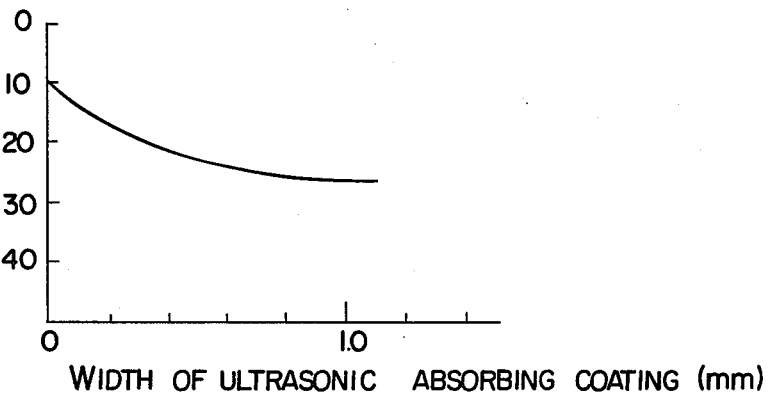
FIG. 2 is a graph showing the relation between the width of the coating of ultrasonic wave absorbing material and the relative intensity of the signal reflected from the end of the prior art reflection-free elastic surface wave device.
Figure 6:
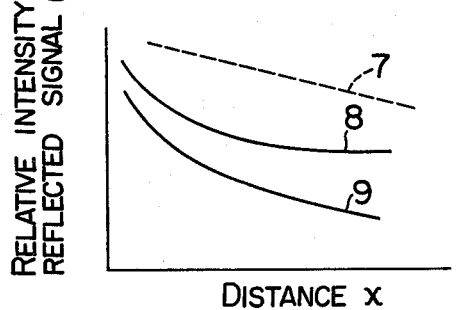
FIG. 6 is a graph showing the relation of the relative intensity of the signal reflected from the end of the device and the width of the coating of ultrasonic wave absorbing material when the reflection from the device portion having the coating of ultrasonic wave absorbing material is taken into account.

The curve 9 in FIG. 6 represents the relation between the relative intensity of the signal portion reaching the end of the substrate of the device and reflected back therefrom and the width of the coating 4 of ultrasonic wave absorbing material. The curve 7 in FIG. 6 represents the rate of attenuation when the absorption by the ultrasonic wave absorbing material is only resorted to, and the curve 8 represents the rate of attenuation when the above-mentioned reflection is only resorted to. Thus, the curve 9 shown in FIG. 6 represents the product (the sum in dB) of the values of the corresponding portions the curves 7 and 8 and substantially qualitatively coincides well with the curve shown in FIG. 2. This proves the reasonability of the interpretation of the saturation phenomenon discussed hereinbefore.

Therefore, in order to reduce the amount of the unnecessary elastic surface wave portion propagating toward the end of the substrate of piezo-electric material, the rate of reflection in the device portion having the coating of the ultrasonic wave absorbing material should be increased. In other words, the attenuation saturation phenomenon in the device portion having the coating of ultrasonic wave absorbing material should be avoided, and the abrupt attenuation effect in the vicinity of the edge portion of the coating of ultrasonic wave absorbing material should be utilized to attain the greatest effect of absorption which overcomes the attenuation saturation phenomenon.

Suppose that dZ is the difference between the acoustic impedance of two points spaced apart by a minute distance of dx, then, the reflection coefficient R can be readily given by the following equation in view of its definition:

$$R \approx |dZ/2Z_A| = \tfrac{1}{2}|1/Z_A| \cdot |dZ/dx| dx$$

where $Z_A$ represents the acoustic impedance at a reference point.

It will be apparent from the above equation that the rate of positional variation of the acoustic impedance Z should be selected to be large in order to increase the reflection coefficient R. It can be therefore seen that the reflection coefficient R can be increased when the acoustic impedance Z is varied abruptly as shown by the curve 10 in FIG. 7 instead of making a monotonous variation as shown in FIG. 6. Summarizing the above discussion, efficient reduction of the relative intensity of the unnecessary surface wave signal reflected from the end of the elastic surface wave device can be attained when the reflection coefficient of a predetermined region interior of the end of the device should be increased, that is, the acoustic impedance distribution in this region should be varied over a wide range.

Figure 7:
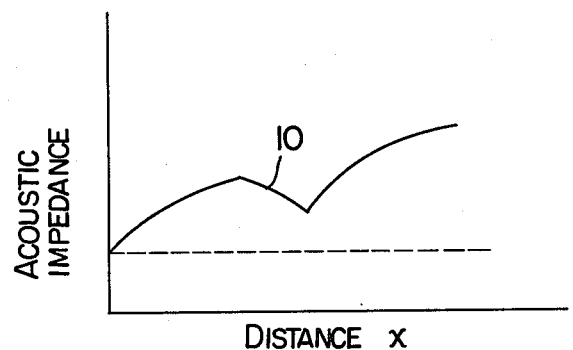
FIGS. 7 and 8 illustrate the basic principle of the electric surface wave device according to the present invention, FIG. 7 showing the relation between the acoustic impedance and the distance, and FIG. 8 showing the relation between the reflection coefficient and the distance.
Figure 8:
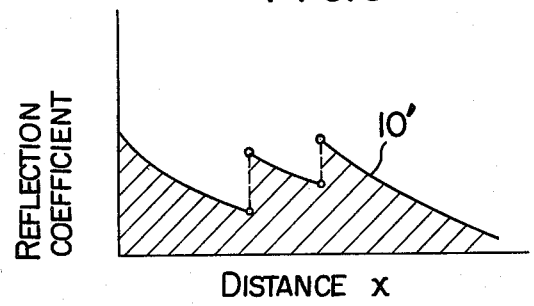

As an example of realizing such a technical idea, the acoustic impedance in the predetermined region should have a distribution as shown by the curve 10 in FIG. 7. In this case, the reflection coefficient varies in a manner as shown by the curve 10' in FIG. 8. The rate of reflection of the elastic surface wave portion in this case is greater than that shown in FIG. 5 since it is proportional to the area of the hatched portion of the curve 10' in FIG. 8.

It will be understood from the above description that, in the elastic surface wave device according to the present invention, two kinds of ultrasonic wave absorbing materials having different acoustic impedances are coated in closely adjacent relation on the substrate surface so as to provide an acoustic impedance distribution as shown in FIG. 7 thereby further reducing the relative intensity of the signal reflected from the end of the element.

Figure 9:
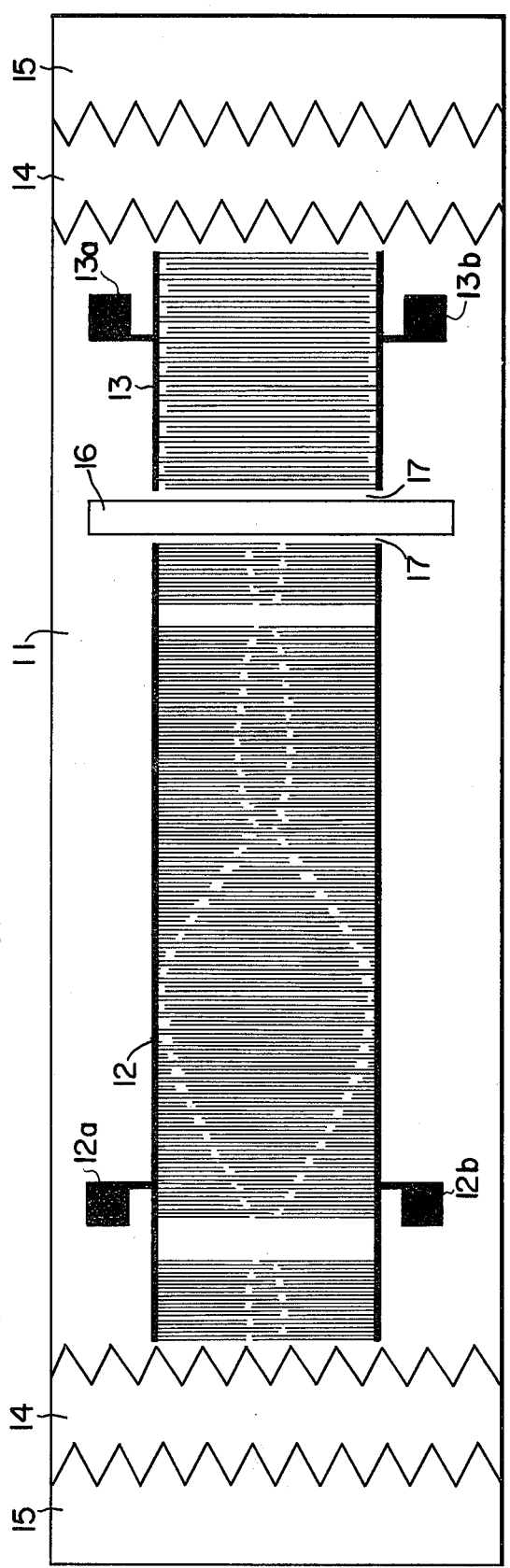
FIG. 9 is a schematic plan view showing the structure of an embodiment of the elastic surface wave device of the present invention.

A preferred embodiment of the elastic surface wave element according to the present invention will be described in detail with reference to FIG. 9. Referring to FIG. 9 which is a schematic plan view showing the structure of the elastic surface wave device embodying the present invention, it comprises a substrate 11 of piezo-electric material such as lithium niobate (LiNbO$_3$), an electro-mechanical transducer or an input electrode 12 having input terminals 12a and 12b for converting an electrical signal into an elastic surface wave, and a mechano-electrical transducer or an output electrode 13 having output terminals 13a and 13b for converting the elastic surface wave into the electrical signal again. Coatings 14 and 15 of ultrasonic wave absorbing materials are applied to the substrate surface by the known screen printing method. The first ultrasonic wave absorbing material forming the coatings 14 has an ultrasonic wave absorption coefficient different from that of the second ultrasonic wave absorbing material forming the coatings 15. The first and second ultrasonic wave absorbing materials are, for example, a silicone resin and a polybutadiene resin respectively. An earth electrode 16 is disposed between the input electrode 12 and the output electrode 13 so that the signal may not be directly transmitted without being transmitted in the form of the elastic surface wave propagating along the propagation path in the surface layer of the piezo-electric substrate 11.

In FIG. 9, the input electrode 12, its input terminals 12a, 12b, the output electrode 13 and its output terminals 13a, 13b are depicted in black in stead of white due to the difficulty of preparation of the drawing.

Figure 10:
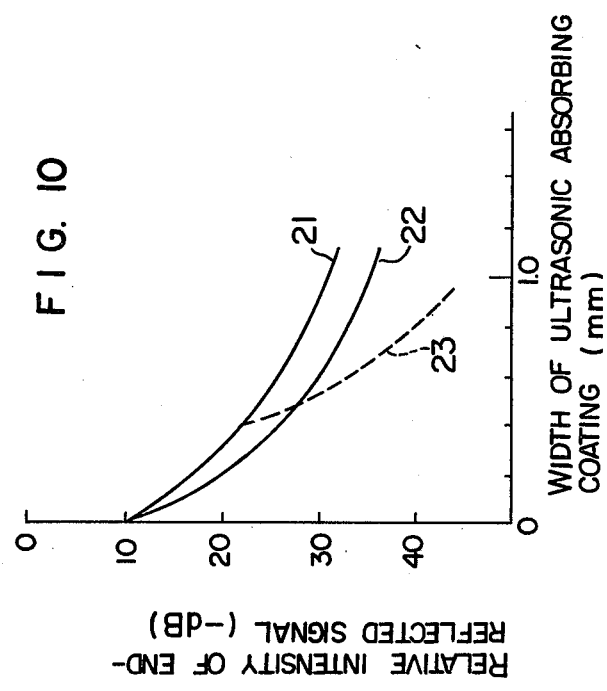
FIG. 10 is a graph showing the relation between the width of the coatings and the relative intensity of the signal reflected from the end of the device to compare the relative intensity, when a first ultrasonic wave absorbing material in the form of a silicone resin and a second ultrasonic wave absorbing material in the form of a polybutadiene resin are independently coated, with that when such materials are coated in combination in closely adjacent relation.

FIG. 10 is a graph showing the relative intensity of the end-reflected signal and the width of the coatings 14 and 15 in the embodiment shown in FIG. 9. A silicone resin and a polybutadiene resin are selected as the first and second ultrasonic wave absorbing materials forming the coatings 14 and 15 respectively, and the signal intensities when these materials are independently coated on the substrate surface are compared with that when both these two materials are coated in closely adjacent relation on the substrate surface. The curve 21 in FIG. 10 represents the above relation when the silicone resin coatings 14 are solely provided, and the curve 22 represents the above relation when the polybutadiene resin coatings 15 are solely provided. The curve 23 represents the above relation when the first coatings 14 of silicone resin having a width of about 0.4 mm are applied, and then, the second coatings 15 of polybutadiene resin having a width of about 0.6 mm are applied in closely adjacent relation to the first coatings 14. It will be seen from FIG. 10 that the relative intensity of the end-reflected signal can be reduced more effectively than hitherto in the device according to the present invention.

The intensity of the end-reflected signal relative to the main signal is about −30 dB when the silicone resin coatings 14 having a width of 1 mm are singly applied, and about −35 dB when the polybutadiene resin coatings 15 having also a width of 1 mm are singly applied, as shown in FIG. 10. However, both these two coatings 14 and 15 having respective widths of 0.4 mm and 0.6 mm are applied in closely adjacent relation according to the basic idea of the present invention, the relative intensity of the end-reflected signal can be reduced to about −45 dB as shown in FIG. 10.

For the sake of reference, a method of making the elastic surface wave device of the present invention will be briefly described. A crystal of lithium niobate (LiNbO$_3$) which is free from any inherent strain in the crystallographical sense and has a smooth and flat mirror-like surface is used to provide the piezo-electric substrate 11. The conventional vacuum evaporation technique well known in the art is used to evaporate on the substrate surface a thin film of metal such as aluminum which provides the input electrode 12, output electrode 13 and earth electrode 16. Then, the etching technique also well known in the art, for example, the photoetching technique is used to remove aluminum film portions except the pattern corresponding to the input electrode 12, output electrode 13 and earth electrode 16 shown in FIG. 9. It is needless to say that the input terminals 12a, 12b and output terminals 13a, 13b for the electrical connection with external circuits are formed simultaneously with the input electrode 12 and output electrode 13 respectively.

Then, the ultrasonic wave absorbing materials according to the present invention are coated on substrate surface portions except the active region of the elastic surface wave device occupied by the input electrode 12, elastic surface wave propagation path 17, output electrode 13 and earth electrode 16, for example, on the substrate surface portions intermediate the region occupied by the active elements and the opposite end edges of the elastic surface wave device, so as to prevent deterioration of the various properties of the elastic surface wave device owing to the reflection of the unnecessary elastic surface wave portion.

According to the present invention, the first ultrasonic wave absorbing material which may be a silicone resin and the second ultrasonic wave absorbing material which may be a polybutadiene resin are then coated to provide the respective coatings 14 and 15 having predetermined widths as shown in FIG. 9. The screen printing method used for the formation of circuit elements of a hybrid integrated circuit is effectively applicable to the printing of the coatings 14 and 15.

In the step of coating the first ultrasonic wave absorbing material, the silicone resin is coated by the screen printing method at the predetermined locations on the surface of the elastic surface wave element and is then subjected to preliminary curing. Heating at 120° C. for two hours is one of suitable heating conditions for the curing. In the subsequent step of coating the second ultrasonic wave absorbing material, the polybutadiene resin is coated by the same printing method at the predetermined locations on the surface of the ultrasonic surface wave element and is then subjected to curing. Heating at 200° C. for one hour is one of suitable heating conditions for the curing.

Necessary processing is then applied to the elastic surface wave device after the above steps, and finally, the elastic surface wave device is packaged into a sealed structure which secures the especially important reliability against the external environmental atmosphere, thereby completing an electronic device.

The effect similar to that above described can be obtained when an epoxy-modified silicone resin and another polybutadiene resin are used as the first and second ultrasonic wave absorbing materials 14 and 15 respectively. The effect similar to that above described can also be obtained even when the coated positions of the first and second ultrasonic wave absorbing materials relative to the advancing direction of the unnecessary elastic surface wave are reserved from those shown in FIG. 9, and such will be readily understood without offering new data for such a case. The shape of the end edge of each of the coatings of ultrasonic wave absorbing materials on the advancing side of the unnecessary elastic surface wave may be either linear or serrated in order that the notable effect of the present invention can be exhibited from the practical point of view. Further, any other edge lines may be used in the combination of the first and second ultrasonic wave absorbing materials to exhibit the effect similar to that above described.

Although the coating 14 of first ultrasonic wave absorbing material is shown directly adjoining the coating 15 of second ultrasonic wave absorbing material in FIG. 9, it is apparent from the basic technical idea of the present invention that they may be very slightly spaced from each other or disposed in closely adjacent relation from the practical point of view, and the objects of the present invention can be similarly attained even in such an arrangement.

In the embodiment of the elastic surface wave device according to the present invention shown in FIG. 9, lithium niobate (LiNbO$_3$) is used to form the piezo-electric substrate 11. However, any other suitable piezo-electric materials may be used which include single-crystalline materials such as lithium tantalate (LiTaO$_3$), tellurium oxide (TeO$_2$), rock crystal (SiO$_2$) and bismuth germanate (BGO; Bi$_{12}$ Ge O$_{20}$); piezo-electric ceramic materials such as lead titanate zirconate ceramics (PZT), barium titanate ceramics (BaTiO$_3$) and lead titanate ceramics (PbTiO$_3$); and such piezo-electric materials as zinc oxide (ZnO), zirconium oxide (ZrO$_2$) and cadmium sulfide (CdS). It is to be understood that the present invention is equally effectively applicable to elastic surface wave devices comprising substrates of these piezo-electric materials.

It will be understood from the foregoing detailed description of the elastic surface wave element according to the present invention that reflection of an unnecessary elastic surface wave from the end of the device can be minimized to permit the desired reduction in the size of the substrate of the element. The substantial attenuation or elimination of the unnecessary signal in the elastic surface wave device helps to promote the utilization of the elastic surface wave device as an electronic part to be used in various electronic apparatus.

I claim:

1. An elastic wave device comprising a substrate of piezo-electric material, an input electrode disposed on the substrate surface for converting an electrical signal into an elastic surface wave, and an output electrode disposed in an elastic surface wave propagation path on the substrate surface for converting a propagating elastic surface wave into the electrical signal again, wherein at least two kinds of ultrasonic wave absorbing materials are disposed in closely adjacent relation in a region on the substrate surface where neither the input and output electrodes nor the elastic surface wave propagation path exists and where unnecessary elastic surface wave propagate, said ultrasonic wave absorbing materials having different acoustic impedances so that the unnecessary elastic surface wave is scattered at an abrupt change in the acoustic impedance between the ultrasonic wave absorbing materials.

2. An elastic surface wave device according to claim 1, wherein said ultrasonic wave absorbing materials are disposed on the substrate in a strip-like manner such that longitudinal axes of the strips extend substantially perpendicular to a direction of propagation of the elastic surface wave.

3. An elastic surface wave device according to claim 1, wherein at least one longitudinal side of the respective strips of wave absorbing material is serrated.

4. An elastic surface wave device comprising a substrate of piezo-electric material, an input electrode disposed on the substrate surface for converting an electrical signal into an elastic surface wave, and an output electrode disposed in an elastic surface wave propagation path on the substrate surface for converting the propagating elastic surface wave into the electrical signal again, wherein at least two kinds of ultrasonic wave absorbing materials having different absorbing characteristics for absorbing an unnecessary elastic surface wave portion are disposed in closely adjacent relation on the substrate surface in a region along an advancing direction of the unnecessary elastic surface wave portion between opposite ends of said substrate, except the active region including said input electrode, said output electrode and said propagation path between said input and output electrodes, said ultrasonic wave absorbing materials being a silicone resin and a polybutadiene resin.

5. An elastic surface wave device as claimed in claim 4, wherein said silicone resin is coated on the substrate surface at a location nearer to said active region, and said polybutadiene resin is coated on the substrate surface at a location remote from said active region.

6. An elastic surface wave device comprising a substrate of piezo-electric material, an input electrode disposed on the substrate surface for converting an electrical signal into an elastic surface wave, and an output electrode disposed in an elastic surface wave propagation path on the substrate surface for converting the propagating elastic surface wave into the electrical signal again, wherein at least two kinds of ultrasonic wave absorbing materials having different absorbing characteristics for absorbing an unnecessary elastic surface wave portion are disposed in closely adjacent relation on the substrate surface in a region along an advancing direction of the unnecessary elastic surface wave portion between opposite ends of said substrate, except the active region including said input electrode, said output electrode and said propagation path between said input and output electrodes, said ultrasonic wave absorbing materials being an epoxy-modified silicone resin and a polybutadiene resin.

7. An elastic surface wave device as claimed in claim 6, wherein said epoxy-modified silicone resin is coated on the substrate surface at a location nearer to said active region, and said polybutadiene resin is coated on the substrate at a location remote from said active region.